United States Patent
Tu et al.

(10) Patent No.: US 6,352,919 B1
(45) Date of Patent: Mar. 5, 2002

(54) METHOD OF FABRICATING A BORDERLESS VIA

(75) Inventors: Yeur-Luen Tu, Taichung; Bor-Wen Chan; Yuan-Hung Liu, both of Hsinchu, all of (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 09/620,033

(22) Filed: Jul. 20, 2000

(30) Foreign Application Priority Data

Apr. 17, 2000 (TW) .......................... 089107138

(51) Int. Cl.⁷ .......................... H01L 21/4763
(52) U.S. Cl. .............. 438/637; 438/636; 438/634; 438/672; 257/750; 257/774
(58) Field of Search .................. 438/629, 637, 438/624, 636, 672, 675, 634, 648; 257/750, 759, 774

(56) References Cited

U.S. PATENT DOCUMENTS

| | | | |
|---|---|---|---|
| 6,087,724 A | * 7/2000 | Shields | 257/734 |
| 6,133,143 A | * 10/2000 | Lin et al. | 438/627 |
| 6,159,845 A | * 12/2000 | Yew et al. | 438/637 |
| 6,225,207 B1 | * 5/2001 | Parikh | 438/622 |
| 6,228,760 B1 | * 5/2001 | Yu et al. | 438/636 |

\* cited by examiner

*Primary Examiner*—Charles Bowers
*Assistant Examiner*—Hsien-Ming Lee
(74) *Attorney, Agent, or Firm*—Darby & Darby

(57) ABSTRACT

A method of fabricating a borderless via is disclosed. A semiconductor substrate having a first dielectric layer thereon is provided. Next, a first conductive structure and a second conductive structure whose area is much smaller than said first conductive structure are formed on said first dielectric layer. After that, a second dielectric layer with an uneven surface is formed. Then, a planarizing layer is coated over said second dielectric layer to fill said uneven surface. Next, an etch back process is used to create a etching stop layer consisting of a portion of second dielectric layer. Subsequently, a third dielectric layer is formed over said second dielectric layer followed by selectively etching said third dielectric layer until said second dielectric layer is exposed to create a borderless via.

19 Claims, 6 Drawing Sheets

METHOD OF FABRICATING A BORDERLESS VIA

FIELD OF THE INVENTION

The present invention relates, in general, to a technique of fabricating an ultra large-scale integration (VLSI) circuits, and more particularly, to a method of fabricating a borderless via.

DESCRIPTION OF THE RELATED ART

During manufacturing of a semiconductor integrated circuit, electrically conductive materials patterned in electrical circuitry are layered over a base transistor structure that is disposed on a semiconductor substrate. The electrically conductive materials, such as aluminum or copper, are in different and noncontiguous planes. Vias or pathways connect the various layers of electrically conductive materials.

Referring to FIGS. 1A through 1D, the cross-sectional Aside views of a conventional method of fabricating a borderless via are depicted in sequence.

Referring now to FIG. 1A, a first dielectric layer 15 is formed on a semiconductor substrate 10 consisting of monocrystal silicon. A metallic plug 17 is filled in a via 16 which is formed through the first dielectric layer 15. Then, a first conductive structure 11b and a second conductive structure 11a, such as aluminum or aluminum-copper alloy, serving as interconnects are formed on the first dielectric layer 15. In addition, the area of the second conductive structure 11a is much smaller than that of the first conductive structure 11b.

Next, as shown in FIG. 1B, a second dielectric layer 20 is coated over the first dielectric layer 15. The second dielectric layer 20 is organic low dielectric constant (low k) material (for example k<4), the organic low k material can result in an uneven surface of the second dielectric layer 20 since the thickness d1 above the first conductive structure 11b is larger than the thickness d2 above the second conductive structure 11a.

As shown in FIG. 1C, the second dielectric layer 20 is etched back to leave a second dielectric layer 20a, which can be served as an etching-stop layer and has a very thin thickness.

Referring now to FIG. 1D, a third dielectric layer 40 is formed over the second dielectric layer 20a. After that, borderless vias 52, 54 are formed by selective removal of the third dielectric layer 40.

However, the formation of the second dielectric layer 20a that serves as an etching-stop layer is difficult to control. The remaining second dielectric layer 20a upon the first conductive structure 11b with large area can cause disconnect of the various layers of electrically conductive materials. On the other hand, it can also cause inappropriate connection (short) between metallic plug 17 and a conductive material filling within the via 52 in the subsequent step.

SUMMARY OF THE INVENTION

In view of the above disadvantages, an object of the invention is to provide a method of fabricating a borderless via so as to form a desirable and appropriate etching stop layer consisting of a portion of second dielectric layer.

Another object of the invention is to provide a method of fabricating a borderless via so that the dielectric material disposed on the conductive structures is substantially removed thereby eliminating the troubles of the prior art.

The above object is attained by providing a method of fabricating a borderless via, comprising the steps of: providing a substrate having a first dielectric layer thereon; forming a first conductive structure and a second conductive structure whose area is smaller than said first conductive structure on said first dielectric layer; forming a second dielectric layer with an uneven surface over said first conductive structure and said second conductive structure; coating a planarizing layer over said second dielectric layer to fill said uneven surface; etching back said planarizing layer and a part of said second dielectric layer so that the upper surface of said second dielectric layer is lower than the upper surfaces of said first conductive structure and said second conductive structure; forming a third dielectric layer over said second dielectric layer; and selectively etching said third dielectric layer until said second dielectric layer is exposed to create a borderless via.

Furthermore, in the method of fabricating a borderless via according to the present invention, the first conductive structure and the second conductive structure can comprise materials selected from the group consisting of aluminum, copper, tungsten, silver, gold, and their respective alloys.

Furthermore, in the method of fabricating a borderless via according to the present invention, the first dielectric layer and the third dielectric layer can comprise oxide such as silicon dioxide formed by CVD.

Furthermore, in the method of fabricating a borderless via according to the present invention, the second dielectric layer can comprise organic low dielectric constant (low k, for example k<3) material such as fluorinated poly (arylene ether) polymer (FLARE™) or SiLK produced by Dow Chemical Company. Moreover, the planarizing layer can comprise organic photoresist, anti-reflection coating (BARC), or inorganic spin-on-glass (SOG).

In addition, in the method of fabricating a borderless via according to the present invention, the third dielectric layer has an etch selectivity of about 5:1 to about 10:1 with respect to the second dielectric layer. Also, the planarizing layer, such as organic photoresist, BARC, has an etch selectivity of about 1:1 with respect to said second dielectric layer. In addition, the planarizing layer, such as SOG, has an etch selectivity of about 1:3~1:5 with respect to said second dielectric layer.

Furthermore, in the method of fabricating a borderless via according to the present invention can further comprise a step of filling a conductive material, such as tungsten, within the borderless via to create a conductive plug.

BRIEF DESCRIPTION OF THE DRAWINGS

The preferred embodiment of the invention is hereinafter described with reference to the accompanying drawings in which.

DESCRIPTION OF THE PREFERRED EMBODIMENTS

The preferred embodiment of the invention is illustrated in FIGS. 2A through 2G of the drawings.

Figure 1A:
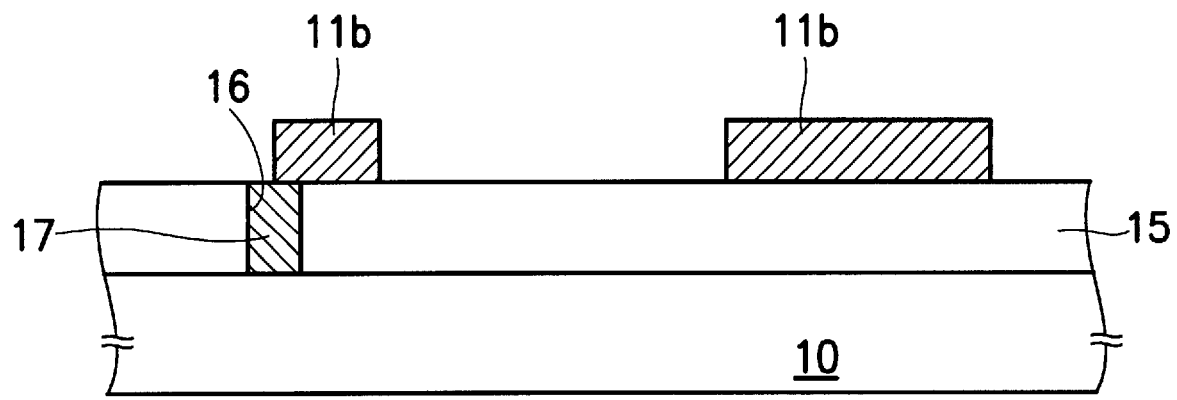
FIGS. 1A through 1D are cross-sectional side views a semiconductor substrate showing the steps of fabricating a borderless via of the prior art.
Figure 1B:
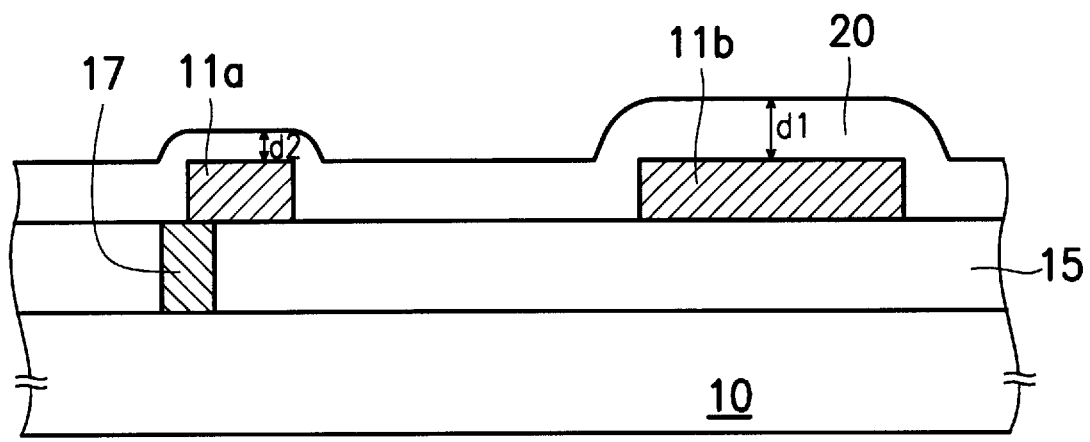
Figure 1C:
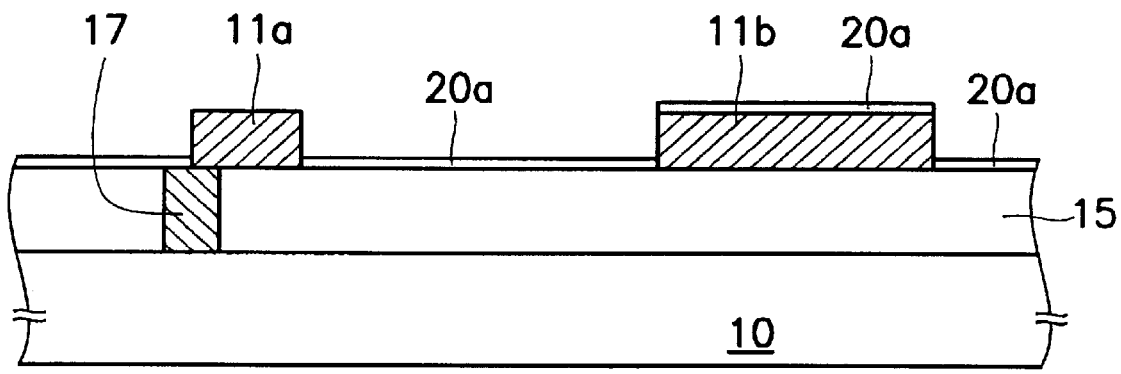
Figure 1D:
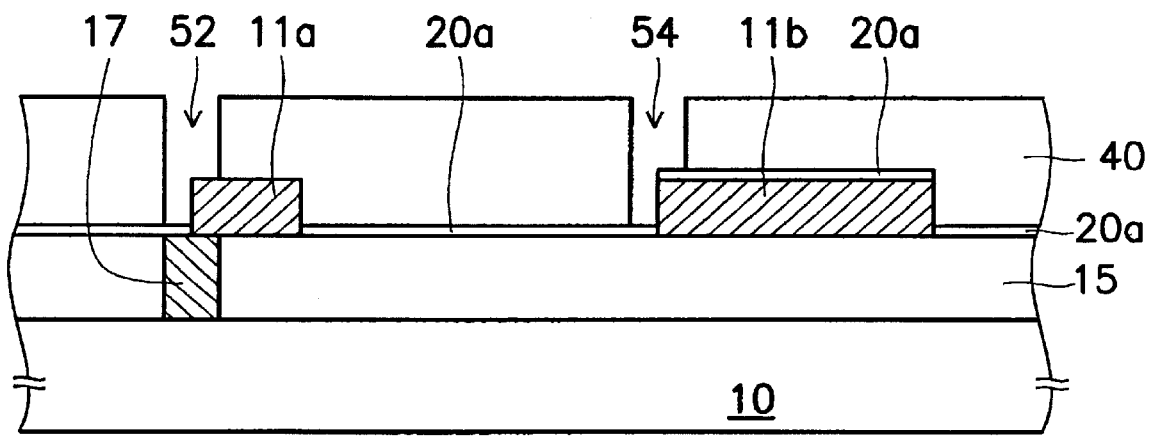
Figure 2A:
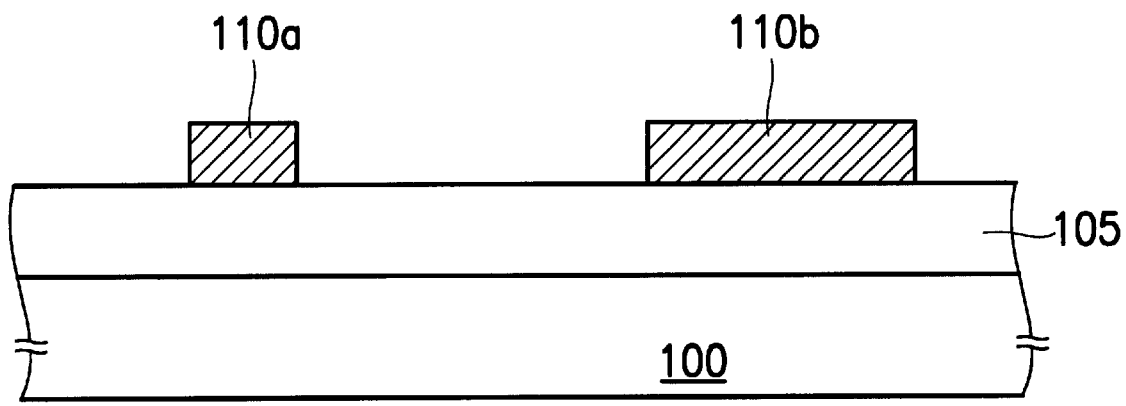
FIGS. 2A though 2G are cross-sectional side views showing the steps of fabricating a borderless via of the present invention.

Referring now to FIG. 2A, a cross-sectional view of the starting step is schematically shown. In FIG. 2A, a first dielectric layer 105 is formed on a semiconductor substrate 100 consisting of mono-crystal silicon. In one embodiment, the first dielectric layer 105 is oxide. Then, a first conductive structure 110b and a second conductive structure 110a, such as aluminum or aluminum-copper alloy, serving as interconnects are formed on the first dielectric layer 105. In addition, the area of the second conductive structure 110a is much smaller than that of the first conductive structure 110b.

Figure 2B:
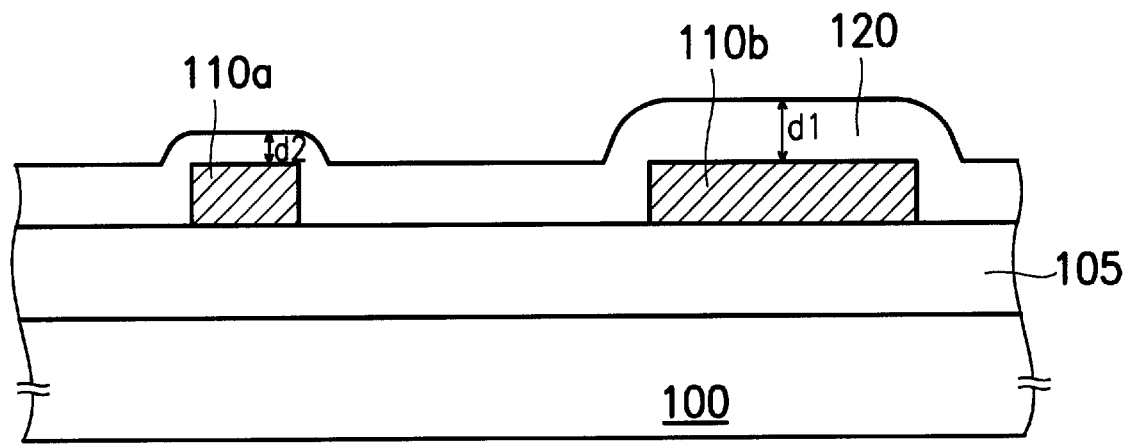

Next, as shown in FIG. 2B, a second dielectric layer 120 is preferably spin coated over the first dielectric layer 105. The second dielectric layer 120 can be organic low dielectric constant material such as but not limited to fluorinated poly (arylene ether) polymer (FLARE) or SiLK produced by Dow Chemical Company. Due to the difference of the area of the first conductive structure 110b and the second conductive structure 110a, these organic low k materials can result in an uneven surface of the second dielectric layer 120 since the thickness d1 above the first conductive structure 110b is larger than the thickness d2 above the second conductive structure 110a.

Figure 2C:
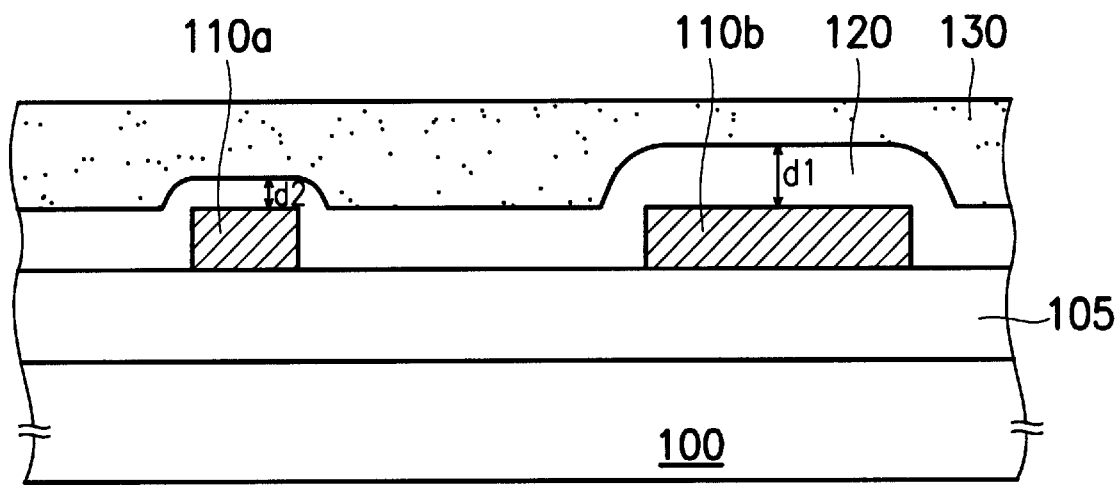

As shown in FIG.2C, a planarizing layer 130 is coated over the second dielectric layer 120 to fill within the uneven surface described above by spin coating. The planarizing layer has a etch selectivity of about 1:1 with respect to the second dielectric layer 120 and is preferably organic photoresist, or bottom anti-reflection coating (BARC). It is to be understood that other material such as spin-on-glass (SOG) can also be used.

Figure 2D:
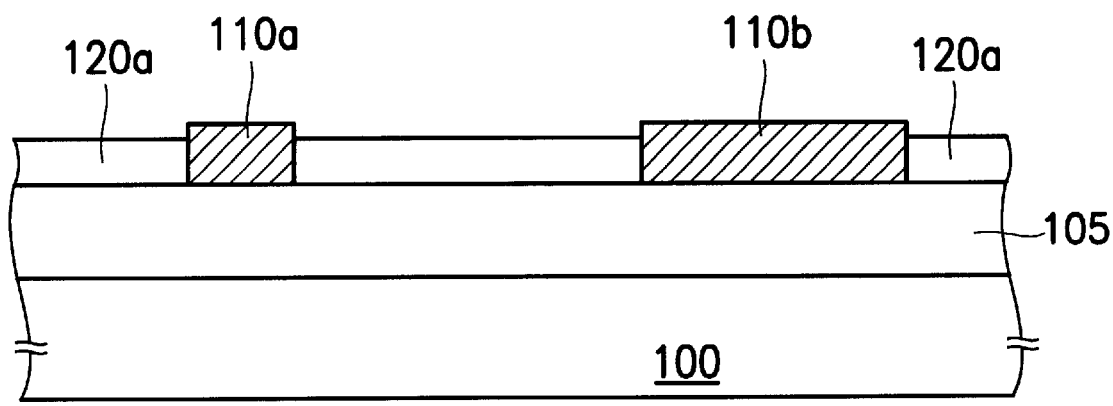

Referring now to FIGS. 2C and 2D, an oxygen plasma etching step is utilized to etch back the planarizing layer 130 and a part of the second dielectric layer 120 so that the upper surface of the second dielectric layer 120 is lower than the upper surfaces of the first conductive structure 110b and the second conductive structure 110a to reveal the first conductive structure 110b and the second conductive structure 110a and to leave a second dielectric layer 120a which serves as an etching stop layer.

Figure 2E:
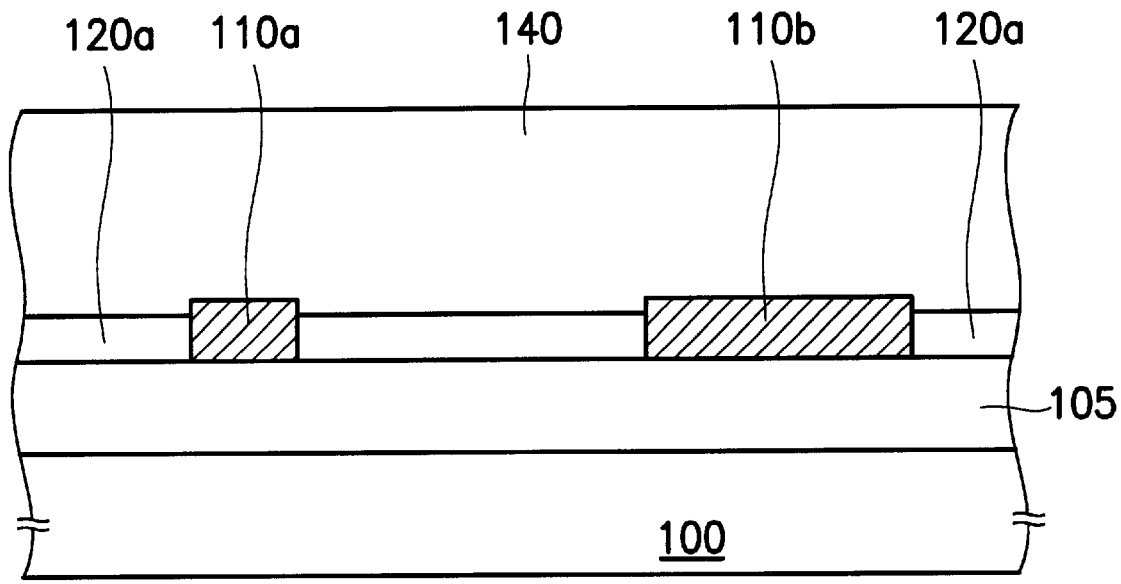

In FIG. 2E, a third dielectric layer 140 such as but not limited to oxide is formed over the second dielectric layer 120a. In one embodiment, the third dielectric layer 140 has an etch selectivity of about 5:1 to about 10:1 with respect to the second dielectric layer 120a.

Figure 2F:
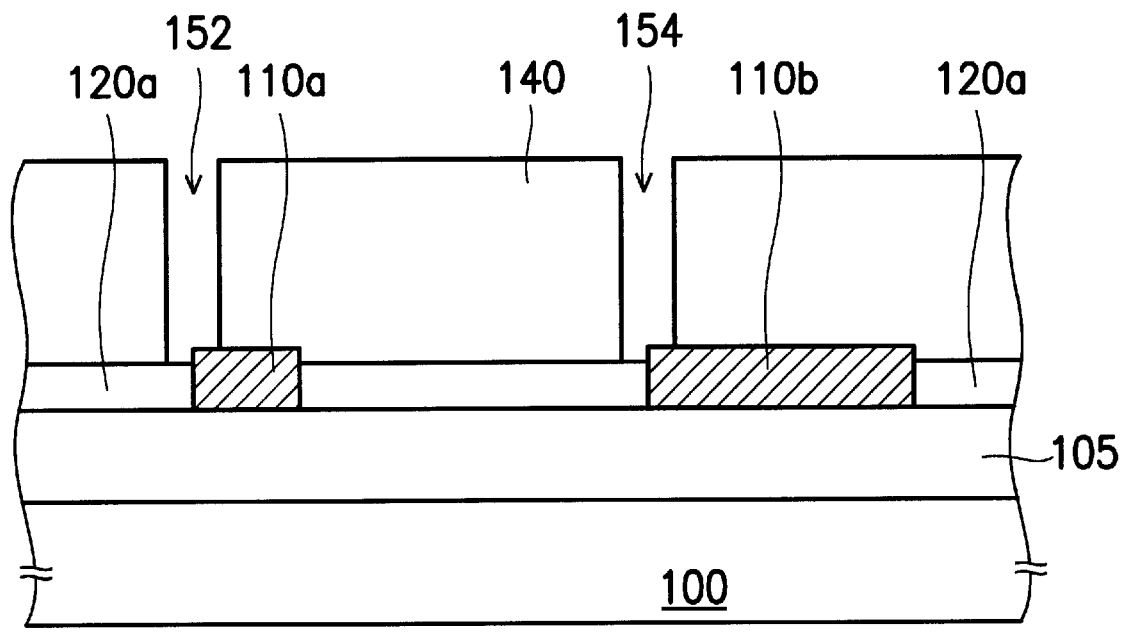

Referring to FIG. 2F, titanium nitride layer (not shown) is formed by ionized metal plasma (IMP) or metal organic chemical vapor deposition (MOCVD), next, conventional photolithography techniques and an etching step with a fluoride-containing plasma are used to selectively etch the third dielectric layer 140 until the second dielectric layer 120a is exposed so as to create a borderless via 154 that can connect to the first conductive structure 110b and a borderless via 152 that can connect to the second conductive structure 110a.

Figure 2G:
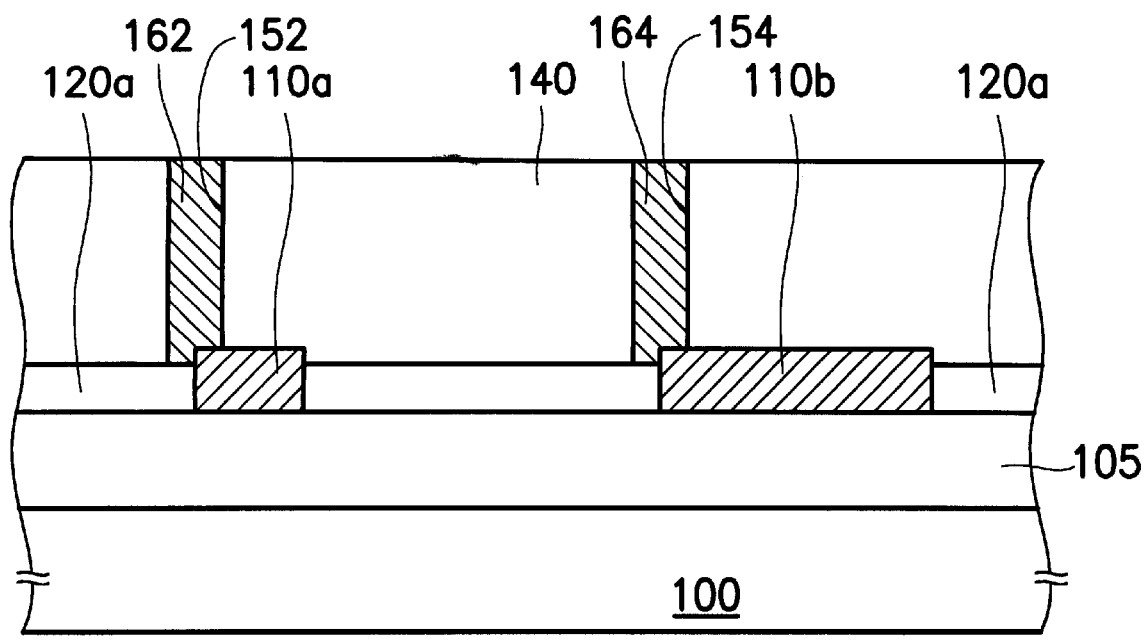

As shown in FIG. 2G, a conductive material such as tungsten is used to fill within the borderless via 152 and 154 to create conductive plugs 162, and 164 by chemical vapor deposition with $WF_6$ as a reactive gas. It is to be understood that other conductive materials can also be used to form conductive plugs 162, and 164.

One of the characteristics of the invention is that the formation of a planarizing layer upon the uneven surface of the second dielectric layer. In addition, the etch properties of the planarizing layer and the second dielectric layer are very similar (the etch selectivity is about 1:1). Therefore, an etching stop layer that consists of the second dielectric layer and has an appropriate thickness is reachable. According to the present invention, the problems of the prior art can be eliminated.

While the invention has been described with reference to various illustrative embodiments, the description is not intended to be construed in a limiting sense. Various modifications of the illustrative embodiments, as well as other embodiments of the invention, will be apparent to those persons skilled in the art upon reference to this description. It is therefore contemplated that the appended claims will cover any such modifications or embodiments as may fall within the scope of the invention defined by the following claims and their equivalents.

What is claimed is:

1. A method of fabricating a borderless via, comprising the steps of:

providing a substrate having a first dielectric layer thereon;

forming a first conductive structure and a second conductive structure whose area is smaller than said first conductive structure on said first dielectric layer;

forming a second dielectric layer with an uneven surface over said first conductive structure and said second conductive structure;

coating a planarizing layer over said second dielectric layer to fill said uneven surface;

etching back said planarizing layer and a part of said second dielectric layer so that all of the upper surface of said second dielectric layer is lower than the upper surfaces of said first conductive structure and said second conductive structure;

forming a third dielectric layer over said second dielectric layer and said first and second conductive structures and selectively etching said third dielectric layer until said second dielectric layer is exposed to create a borderless via.

2. A method of fabricating a borderless via as claimed in claim 1, wherein said first conductive structure and said second conductive structure comprise materials selected from the group consisting of aluminum, copper, tungsten, silver, gold, and their respective alloys.

3. A method of fabricating a borderless via as claimed in claim 1, wherein said first dielectric layer and said third dielectric layer comprise oxide.

4. A method of fabricating a borderless via as claimed in claim 1, wherein said second dielectric layer comprises organic low dielectric constant (low k) material.

5. A method of fabricating a borderless via as claimed in claim 4, wherein said second dielectric layer comprises fluorinated poly (arylene ether) polymer (FLARE).

6. A method of fabricating a borderless via as claimed in claim 4, wherein said second dielectric layer comprises SiLK produced by Dow Chemical Company.

7. A method of fabricating a borderless via as claimed in claim 1, wherein said planarizing layer comprises organic photoresist.

8. A method of fabricating a borderless via as claimed in claim 1, wherein said planarizing layer comprises bottom anti-reflection coating (BARC).

9. A method of fabricating a borderless via as claimed in claim 7 or 8, wherein said planarizing layer has an etch selectivity of about 1:1 with respect to said second dielectric layer.

10. A method of fabricating a borderless via as claimed in claim 1, wherein said planarizing layer comprises inorganic spin-on-glass (SOG).

11. A method of fabricating a borderless via as claimed in claim 10, wherein said planarizing layer has an etch selectivity of about 1:3 to about 1:5 with respect to said second dielectric layer.

12. A method of fabricating a borderless via as claimed in claim 1, wherein said third dielectric layer has an etch selectivity of about 5:1 to about 10:1 with respect to said second dielectric layer.

13. A method of fabricating a borderless via as claimed in claim 1, wherein further comprising a step of filling a conductive material within said borderless via to create a conductive plug.

14. A method of fabricating a borderless via as claimed in claim 13, wherein said conductive material is tungsten.

15. A semiconductor structure having a borderless via comprising:
   a substrate having a first dielectric layer thereon;
   a first conductive structure formed on the first dielectric layer;
   a second conductive structure, also formed on the first dielectric layer, whose area is smaller than that of the first conductive structure formed on the first dielectric layer;
   a second dielectric layer with an uneven surface formed over the first conductive structure and the second conductive structure;
   a planarizing layer coated over the second dielectric layer to fill the uneven surface of the second dielectric layer wherein the planarizing layer and a part of the second dielectric layer are etched back so that all of the upper surface of the second dielectric layer is lower than the upper surfaces of the first conductive structure and the second conductive structure;
   a third dielectric layer formed over the second dielectric layer and the first and second conductive structures wherein the third dielectric layer is selectively etched until the second dielectric layer is exposed to create the borderless via.

16. The semiconductor structure of claim 15 further comprising a conductive plug created by filling a conductive material within the borderless via.

17. The semiconductor structure of claim 15 wherein the first and second conductive structures further comprise materials selected from the group consisting of aluminum, copper, tungsten, silver, gold and their respective alloys.

18. The semiconductor structure of claim 15 wherein the planarizing layer further comprise materials selected from the group consisting of organic photoresist, bottom anti-reflection coating (BARC) and inorganic spin-on-glass (SOG).

19. The semiconductor structure of claim 15 wherein the third dielectric layer has an etch selectivity of about 5:1 to about 10:1 with respect to the second dielectric layer.

* * * * *